United States Patent [19]

Molinari

[11] 4,249,255
[45] Feb. 3, 1981

[54] CONTINUOUS TUNING ARRANGEMENT FOR A MULTIBAND TELEVISION RECEIVER

[75] Inventor: Thomas E. Molinari, Indianapolis, Ind.

[73] Assignee: RCA Corporation, New York, N.Y.

[21] Appl. No.: 965,217

[22] Filed: Nov. 30, 1978

[51] Int. Cl.² .............................................. H04B 1/16
[52] U.S. Cl. .................................... 455/176; 334/15; 455/180; 455/195
[58] Field of Search ............... 325/452, 453, 458, 459, 325/464, 465, 468; 334/11, 15; 331/177 R, 177 V; 358/191

[56] References Cited

U.S. PATENT DOCUMENTS

| | | | |
|---|---|---|---|
| 3,492,514 | 1/1970 | Korn | 334/15 |
| 3,526,859 | 9/1970 | Pützer | 334/15 |
| 3,646,450 | 2/1972 | Ma | 325/465 |
| 3,715,495 | 2/1973 | Takezaki et al. | 334/15 |
| 3,906,373 | 9/1975 | Hendrickson | 325/464 |

OTHER PUBLICATIONS

Schematic Diagram for National Model No. TR-512F Television Receiver-Manufactured by Panasonic—Date unknown.
Schematic Diagram for Hitachi Model No. K-1000 Television Receiver—Date unknown.
Schematic Diagram for J. C. Penney Model No. 685-1007, Television Receiver—Date unknown.
"A Television Tuning Method with Automatic Band Switching,"-A. Hashima, Oct. 20, 1978, Trans. on Joint Conf. of West Japanese Branches of Electrical and Electronic Engineering, Translation of Section G14-3, p. G862.

Primary Examiner—Marc E. Bookbinder
Attorney, Agent, or Firm—Paul J. Rasmussen; Allen L. Limberg; Peter M. Emanuel

[57] ABSTRACT

A tuning system includes a resistive element coupled between two terminals and a movable contact which is moved along the resistive element to determine the tuning position. A switching arrangement selectively couples predetermined voltages to the terminals as a function of the position of the movable contact so that a tuning voltage for tuning all the channels in the low VHF, high VHF and UHF bands is generated at the movable contact as it is continuously and consecutively moved along the resistive element.

7 Claims, 2 Drawing Figures

CONTINUOUS TUNING ARRANGEMENT FOR A MULTIBAND TELEVISION RECEIVER

BACKGROUND OF THE PRESENT INVENTION

The present invention pertains to the field of tuners with voltage-variable frequency determining elements.

Electronic tuners for television receivers conventionally comprise a tuned circuit including a varactor diode reverse biased to exhibit a capacitive characteristic and an inductor for each of the television bands. For example, in the United States, television receivers include tuned circuits including a varactor diode and an inductor for a low VHF band including channels 2 through 6, a high VHF band including channels 7 through 13 and a UHF band including channels 14 through 83. The tuned circuits are selectively enabled by bandswitching signals representative of the band in which a selected channel resides. The capacitive reactance of the varactor diode and thereby the frequency to which the tuned circuits are tuned is determined by the magnitude of a tuning voltage.

Many systems for deriving the tuning voltage are known. One of the simplest and therefore most economical types of these systems includes a potentiometer coupled between two points of potential. The tuning voltage is derived at a movable contact or wiper arm of the potentiometer and therefore is continuously variable. This permits a single tuning control for both coarse and fine tuning. In addition, such systems are rapidly tunable compared to so-called mechanical detent tuners.

Unfortunately, in general, the bands of tuning voltage corresponding to the three bands of the television tuning range are not consecutive but rather overlap each other. That is, the magnitudes of tuning voltage corresponding to the lowest frequency channels in the high VHF and UHF bands are lower than the magnitudes of tuning voltage corresponding to the highest frequency channels in the respective one of the preceding bands. Therefore, television tuning systems of this type in which a tuning voltage is generated at the movable contact of a potentiometer have typically not been able to continuously and consecutively tune a television receiver throughout the television tuning range.

SUMMARY OF THE PRESENT INVENTION

In accordance with one feature of the present invention, a system for tuning a receiver to various channels in at least first and second bands includes a continuous resistive element and a movable contact for developing a tuning voltage for a voltage controlled tunable circuit as it is moved along the resistive element. First and second consecutive sections of the resistive element correspond to the first and second bands. A switching arrangement selectively couples predetermined voltages to end terminals of the resistive element dependent on the position of the movable contact along the resistive element so that the various channels are consecutively and continuously tunable.

In accordance with another feature of the present invention, a system for tuning a receiver to various channels in at least first and second bands includes a continuous resistive element, an arrangement for coupling predetermined voltages to the ends of the resistive element and a movable contact for developing a tuning voltage for a voltage tunable circuit as it is moved along the resistive element. A voltage divider is coupled between the ends of the resistive element and develops an output voltage corresponding to a predetermined tuning voltage, e.g., the tuning voltage corresponding to the end of the first band. A comparator is responsive to the tuning voltage and the output voltage of the voltage divider and generates a control signal when the tuning voltage and the output voltage have a predetermined relationship. The control voltage may be utilized, for example, to control the operating range of the voltage tunable circuit and/or coupling the predetermined voltages to the ends of the resistive element for the purpose set forth above.

DETAILED DESCRIPTION OF THE DRAWING

Figure 1:
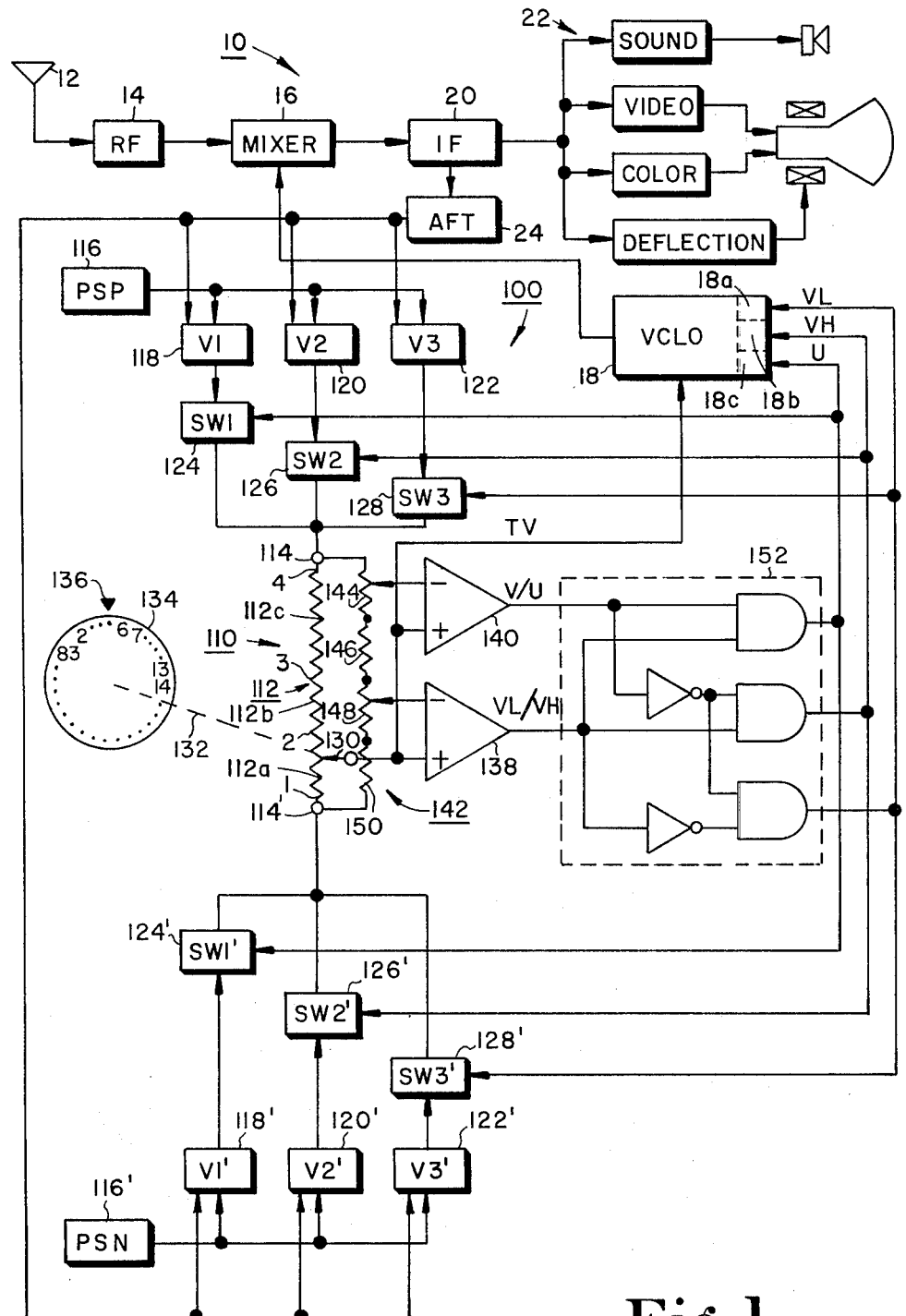
FIG. 1 shows in block diagram form a television receiver employing a tuning system constructed in accordance with the present invention.

In FIG. 1, a television receiver 10 includes an antenna 12 which couples RF signals to an RF signal processing unit 14. RF signal processing unit 14 filters and amplifies the RF signals. A mixer 16 combines the processed RF signals with a local oscillator signal generated by a voltage controlled local oscillator (VCLO) 18 to produce an IF signal. The frequency of the local oscillator signal is controlled in response to the magnitude of a tuning voltage (TV) generated by tuning system 100, which is constructed in accordance with the present invention. The IF signal is amplified and filtered by an IF signal processing unit 20. The processed IF signal contains components bearing video, color, deflection and sound information. The various components of the processed IF signal are coupled to respective sections of a picture and audio portion 22 of receiver 10. An AFT (Automatic Fine Tuning) unit 24 generates an AFT signal in response to the deviation between the video component of the IF signal and its nominal value, e.g., 45.75 MHz in the United States. The AFT signal is coupled to tuning system 100 to modify the tuning voltage to correct for deviations between the frequency of the video component and its nominal frequency.

Voltage controlled local oscillator 18 comprises a tuning arrangement including a varactor diode and an inductor for each of the television tuning bands to which receiver 10 may be tuned. In the United States, the television tuning range is partitioned into a low VHF band for channels 2 through 6, a high VHF band for channels 7 through 13 and a UHF band for channels 14 through 83. In receiver 10 arranged, by way of example, for NTSC standards utilized in the United States, bandswitching signals VL (for the low VHF band), VH (for the high VHF band) and U (for the UHF band) selectively enable respective tuning arrangements 18a, 18b and 18c of VCLO 18 to determine the frequency band in which it oscillates. The magnitude of the tuning voltage determines the specific frequency at which VCLO 18 oscillates. Although the various tuning arrangements are selectively enabled by different bandswitching signals, the same tuning voltage is coupled to each of the arrangements. As is typical, the tuning voltage and bandswitching signals are also coupled to varactor tuning arrangements in RF unit 14 corresponding to those of VCLO 18 so that amplitude versus frequency response of RF unit 14 will track the tuning of VCLO 18. These connections have been omitted from FIG. 1 for the sake of simplicity RF unit 14, mixer 16 and VCLO 18 may comprise the combination of a KRK-228 VHF varactor diode tuner and a KRK-226 UHF varactor diode tuner as disclosed in "RCA Television Service Data—Chassis CTC-74 Series", File 1977, C-9, published by RCA Corporation, Indianapolis, Indiana, hereby incorporated by reference.

Figure 2:
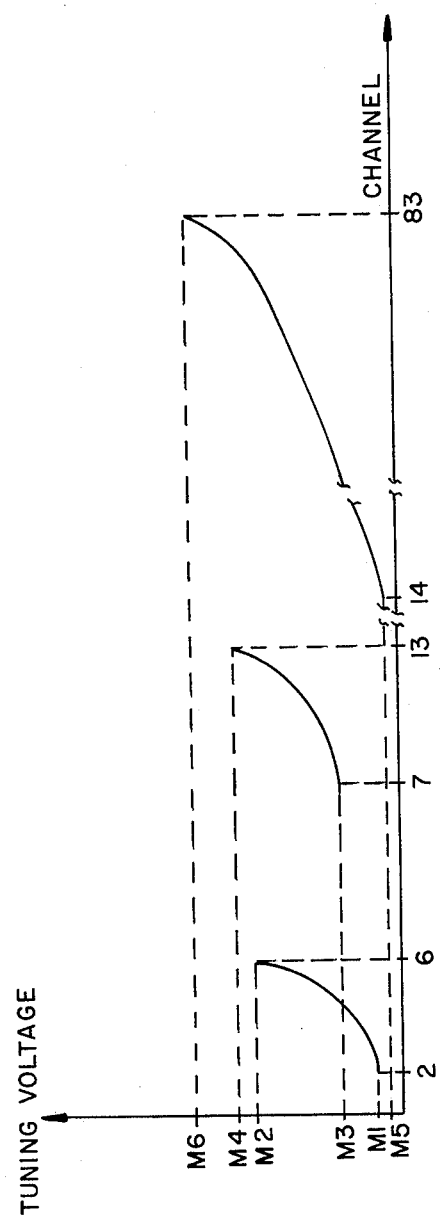
FIG. 2 shows graphical representations of tuning voltage versus channel characteristics of varactor diode tuning arrangements useful in understanding the tuning system shown in FIG. 1.

Typical tuning voltage versus channel frequency characteristics for a varactor oscillator of the type which may be employed as VCLO 18 are shown in FIG. 2. The tuning characteristics for the three bands are separate. The magnitudes for the beginning and end points of the three bands are as indicated: M1 corresponds to the lowest frequency channel in the low VHF band; M2 corresponds to the highest frequency channel in the low VHF band; M3 corresponds to the lowest frequency channel in the high VHF band; M4 corresponds to the highest frequency channel in the high VHF band; M5 corresponds to the lowest frequency channel in the UHF band; and M6 corresponds to the highest frequency channel in the UHF band. The three bands have tuning voltage regions which overlap each other. Thus, although the frequency of channel 7 is higher than the frequency of channel 6, the magnitude of tuning voltage M3 for channel 7 is lower than the magnitude of tuning voltage M2 for channel 6. Similarly, although the frequency of channel 14 is higher than the frequency of channel 13, the magnitude of tuning voltage M5 for channel 14 is lower than the magnitude of tuning voltage M4 for channel 13. As a result, television tuning systems including a potentiometer in which a tuning voltage is generated at the movable contact of the wiper arm have not been continuously and consecutively tunable from channel 2 through channel 83. The tuning system 100 overcomes this deficiency.

Tuning system 100 includes a potentiometer 110 including a continuous resistive element 112 between terminals 114 and 114'. Relative positive voltages V1, V2 and V3 derived from a relatively positive power supply (PSP) 116 by voltage dividers 118, 120 and 122 are selectively coupled to terminal 114 by three switches (SW1, SW2, SW3) 124, 126 and 128, respectively. Relatively negative voltages V1', V2' and V3' derived from a relatively negative power supply (PSN) 116' by voltage dividers 118', 120' and 122' are selectively coupled to terminal 114' by three switches (SW1', SW2' and SW3') 124', 126' and 128', respectively. AFT unit 24 is also coupled to voltage dividers 118, 118', 120, 120', 122 and 122'. The manner in which AFT signals may be coupled to voltage dividers employed in a tuning system is disclosed, for example, in the aforementioned RCA Service Data. The tuning voltage is derived at a movable contact 130 which is moved along resistive element 112 by a shaft 132. Shaft 132 is in turn driven by a tuning dial 134. Channel numbers between 2 and 83 are formed around the periphery of dial 134. A pointer 136 indicates the selected channel.

Points along resistive element 112 correspond to respective channels between 2 and 83. Points 1, 2, 3 and 4 along resistive element 112 define three sections 112a, 112b and 112c corresponding to the low VHF, high VHF and UHF bands. When movable contact 130 is in section 112a, voltages V1 and V1' are coupled to terminals 114 and 114' respectively. Voltages V1 and V1' are selected so that the voltage developed at point 1 has a magnitude slightly less than the magnitude M1 and the voltage developed at point 2 has a magnitude slightly greater than magnitude M2. When movable contact 130 is in section 112b, voltages V2 and V2' are coupled to terminals 114 and 114', respectively. Voltages V2 and V2' are selected so that the voltage developed at point 2 has a magnitude slightly less than magnitude M3 and the voltage developed at point 3 has a magnitude slightly greater than magnitude M4. When movable contact 130 is in section 112c, voltages V3 and V3' are coupled to terminals 114 and 114', respectively. Voltages V3 and V3' are selected so that the voltage developed at point 3 has a magnitude slightly less than magnitude M5 and the voltage developed at point 4 has a magnitude slightly greater than magnitude M6. Assuming, for example, that it is desired that the bands occupy equal angular portions of dial 134 and tuning voltage magnitudes M1, M2, M3, M4, M5 and M6 are 0, +30, 0, +30, 0 and +30 volts, respectively, suitable values for voltages, V1, V1', V2, V2', V3 and V3' are approximately +90, 0, +60, −30, +30 and −60 volts, respectively.

Voltage comparators 138 and 140 determine the position of movable contact 130 along resistive element 112. Each of comparators 138 and 140 has a noninverting (+) input coupled to movable contact 130 and an inverting (−) input coupled to a point along a voltage divider 142. Voltage divider 142 includes potentiometer 144, fixed resistor 146, potentiometer 148 and fixed resistor 150 coupled in series between terminals 114 and 114'. The wipers of potentiometers 144 and 148 are coupled to the inverting (−) inputs of comparators 140 and 138, respectively. The values of potentiometers 144 and 148 and fixed resistors 146 and 150 are selected and the wipers of potentiometers 144 and 148 are adjusted so that when voltages V1 and V1' are coupled to terminals 114 and 114', respectively, the voltage developed at the inverting (−) input of comparator 138 is substantially equal to the voltage developed at point 2 and when voltages V2 and V2' are coupled to terminals 114 and 114', the volage developed at the inverting (−) input of comparator 140 is substantially equal to the voltage developed at point 3. Voltage comparators 138 and 140 generate VL/VH and V/U output voltages, respectively. Each of the output voltages of comparators 138 and 140 has a low (L) level when the voltage developed at the noninverting (+) input is less than the voltage developed at the inverting (−) input and a high (H) level when the voltage developed at the noninverting (+) input is greater than the voltage developed at the inverting (−) input.

A switching logic unit 152 generates the VL, VH and U bandswitching signals in response to the VL/VH and V/U output signals of comparators 138 and 140. The VL, VH and U bandswitching signals are coupled to SW1 124 and SW1' 124', SW2 126 and SW2' 126', and SW3 128 and SW3' 128' to control the selective coupling of voltages V1 and V1', V2 and V2', and V3 and V3' to terminals 114 and 114'. Each of switches 124, 124', 126, 126', 128 and 128' is an electronic single-pole, single-throw switch which is opened in response to a low level and closed in response to a high level. In addition, the bandswitching signals are coupled to VCLO 18 and RF unit 14 (the connections to the latter not being shown) to selectively enable the respective tuned circuit arrangements of each. Each of the tuned circuits in VCLO 18 and RF unit 14 are disabled in response to a low level and enabled in response to a high level. The truth table for comparators 138 and 140 and switching logic unit 152 is as follows:

| POSITION OF CONTACT 130 | VL/VH | V/U | VL | VH | U |
|---|---|---|---|---|---|
| 112a | L | L | H | L | L |
| 112b | H | L | L | H | L |
| 112c | H | H | L | L | H |

It is noted that although the voltages at terminals 114 and 114' are switched, because voltage divider 142 is coupled across resistive element 112, it is not necessary to alter the voltages to which the tuning voltage is compared by comparators 138 and 140 as might otherwise be the case if the inverting (−) inputs of comparators 138 and 140 were coupled to other sources of reference potential.

With tuning system 100, channels 2 through 83 may be continuously and consecutively tuned without manual interruption for bandswitching and without reversal of tuning direction. It is noted that tuning system 100 may employ a potentiometer similar to potentiometers already commercially available comprising, for example, simply a resistive film printed on a ceramic substrate. However, it may be desirable that the resistive film 112 be shaped in sections 112a, 112b and 112c to compensate for the nonlinear tuning voltage versus channel characteristics associated with varactor diodes in a manner similar to that disclosed in United States patent applications having seial numbers 965,201; 965,229 and 965,218, all filed concurrently herewith on Nov. 30, 1978, hereby incorporated by reference. To avoid such shaping the nonlinear tuning voltage versus channel characteristics may be compensated for by electronically processing the tuning voltage generated at movable contact 130. In addition, the resistive element may be formed along a circular path so that channels 2 and 83 can be consecutively tuned in either direction in so-called "wrap around" fashion also disclosed in the aforementioned applications. These and other modifications are considered to be within the scope of the present invention as defined in the following claims.

What is claimed is:

1. In a system for tuning a receiver to all the channels in at least first and second bands in response to respective magnitudes of a tuning voltage, apparatus comprising:

first and second terminals;
a continuous resistive element coupled between said terminals, said resistive element having first and second sections corresponding to said first and second bands, respectively;
voltage coupling means for coupling voltages to said first and second terminals;
a movable contact;
means for moving said movable contact along said resistive element to select ones of said channels, said tuning voltage being generated at said movable contact; and
position detecting means for detecting the position of said movable contact along said resistive element;
said voltage coupling means including at least first switching means coupled to said position detecting means for selectively coupling a first voltage to said first terminal when said movable contact is in said first section and a second voltage to said first terminal when said movable contact is in said second section, said first and second voltages being selected so that all of said channels in said first and second bands are tuned as said movable contact is continuously and consecutively moved along said resistive element.

2. The apparatus recited in claim 1 wherein:
said voltage coupling means includes second switching means for selectively coupling a third voltage to said second terminal when said movable contact is in said first section and a fourth voltage to said second terminal when said movable contact is in said second section, said third and fourth voltages also being selected so that all of said channels in said first and second bands are tuned as said movable contact is continuously and consecutively moved along said resistive element.

3. The apparatus recited in claim 2 wherein:
said first and third voltages are selected so that when said movable contact is in said first section, the voltage developed at a first point defining the beginning of said first section has a magnitude slightly less than the magnitude of said tuning voltage corresponding to the lowest frequency channel in said first band and the voltage developed at a second point defining the end of the first section and the beginning of the second section has a magnitude slightly greater than the magnitude of said tuning voltage corresponding to the highest frequency channel in said first band; and said second and fourth voltages are selected so that when said movable contact is in said second section, the voltage developed at said second point has a magnitude slightly less than the magnitude of said tuning voltage corresponding to the lowest frequency channel in said second band and the voltage developed at a third point defining the end of said second section has a magnitude slightly greater than the magnitude of said tuning voltage corresponding to the highest frequency channel in said second band.

4. The apparatus recited in claim 3 wherein:
said position detecting means includes a voltage divider means coupled between said first and second terminals for generating an output voltage having a magnitude substantially equal to the magnitude of the voltage developed at said second point; and comparator means responsive to said output voltage and to said tuning voltage for generating a control voltage having a first level when the magnitude of said tuning voltage is less than the magnitude of said output voltage and a second level when the magnitude of said tuning voltage is greater than the magnitude of said output voltage; and
said first and second switching means are responsive to the first level of said control voltage to couple said first voltage to said first terminal and said third voltage to said second terminal, respectively, and are responsive to the second level of said control voltage to couple said third voltage to said first terminal and said fourth voltage to said second terminal, respectively.

5. The apparatus recited in claim 4 wherein:
said resistive element has a third section having a beginning at said third point and an end at a fourth point; said first, second and third sections corresponding to a low VHF, a high VHF and a UHF band of the television tuning range;

said first switching means couples a fifth voltage to said first terminal when said movable contact is in said third section and said second switching means couples a sixth voltage to said second terminal when said movable contact is in said third section;

said fifth and sixth voltages being selected so that when said movable contact is in said third section, the voltage developed at said third point has a magnitude slightly less than the magnitude of said tuning voltage corresponding to the lowest frequency channel in said third band and the voltage developed at said fourth point has a magnitude slightly greater than the magnitude of said tuning voltage corresponding to the highest frequency channel in said third band; and said voltage divider means generates a second output voltage having a magnitude substantially equal to the magnitude of the voltage developed at said third point; and second comparator means is responsive to said second output voltage and to said tuning voltage for generating a second control voltage having a first level when the magnitude of said tuning voltage is less than the magnitude of said second output voltage and a second level when the magnitude of said tuning voltage is greater than the magnitude of said second output voltage; and said first and second switching means are responsive to the second level of said second control voltage to couple said fifth voltage to said first terminal and said sixth voltage to said second terminal, respectively.

6. A system for tuning a receiver to various channels in first and second bands, comprising:

a tunable circuit having a frequency response determined in response to a tuning voltage;

first and second terminals;

a resistive element coupled between said first and second terminals;

means for coupling first and second voltages to said first and second terminals;

a movable contact;

means for moving said movable contact along said resistive element, said tuning voltage being generated at said movable contact;

voltage divider means coupled between said first and second terminals for generating an output voltage having a magnitude substantially equal to the magnitude of said tuning voltage corresponding to a boundary between said first and second bands;

comparator means responsive to said output voltage and said tuning voltage for generating a control voltage having a first level when the magnitude of said tuning voltage is less than the magnitude of said output voltage of said voltage divider and a second level when the magnitude of said tuning voltage is greater than the magnitude of said output voltage of said voltage divider; and first means selectively enabled in response to said first level of said control voltage for determining the frequency range of said tunable circuit in said first band and second means selectively enabled in response to said second level of said control voltage for determining the frequency range of said tunable circuit in said second band.

7. The apparatus recited in claim 6 wherein:

said utilization means includes switching means for coupling a first voltage to said first terminal and a second voltage to said second terminal in response to said first level of said control voltage and coupling a third voltage to said first terminal and a fourth voltage to said second terminal in response to the second level of said control voltage, said first, second, third and fourth voltages being selected so that all of said channels in said first and second bands are tuned as said movable contact is continuously and consecutively moved along said resistive element.

* * * * *